(12) United States Patent
Vedula et al.

(10) Patent No.: US 9,286,997 B2
(45) Date of Patent: Mar. 15, 2016

(54) READ ONLY MEMORY ARRAY ARCHITECTURE AND METHODS OF OPERATION

(71) Applicant: Broadcom Corporation, Irvine, CA (US)

(72) Inventors: Narayana Rao Vedula, Minneapolis, MN (US); Dechang Sun, Eden Prairie, MN (US); Myron Buer, Savage, MN (US)

(73) Assignee: Broadcom Corporation, Irvine, CA (US)

( * ) Notice: Subject to any disclaimer, the term of this patent is extended or adjusted under 35 U.S.C. 154(b) by 179 days.

(21) Appl. No.: 13/851,673

(22) Filed: Mar. 27, 2013

(65) Prior Publication Data

US 2014/0268986 A1    Sep. 18, 2014

Related U.S. Application Data

(60) Provisional application No. 61/789,261, filed on Mar. 15, 2013.

(51) Int. Cl.
| | |
|---|---|
| *G11C 17/00* | (2006.01) |
| *G11C 17/08* | (2006.01) |
| *G11C 8/20* | (2006.01) |

(52) U.S. Cl.
CPC ........ *G11C 17/08* (2013.01); *G11C 8/20* (2013.01); *G11C 17/00* (2013.01)

(58) Field of Classification Search
CPC .......................................... G11C 17/00–17/18
USPC ..................................................... 365/94–105
See application file for complete search history.

(56) References Cited

U.S. PATENT DOCUMENTS

| | | | | |
|---|---|---|---|---|
| 5,870,326 | A  * | 2/1999 | Schuelein ...................... 365/94 |
| 8,953,357 | B2 * | 2/2015 | Dozaka ................ G11C 7/1006 365/104 |
| 2009/0219746 | A1 * | 9/2009 | Bosmuller et al. .............. 365/72 |
| 2011/0211382 | A1 * | 9/2011 | Sharma et al. ................. 365/104 |
| 2011/0273919 | A1 * | 11/2011 | Buer ....................... G11C 8/10 365/104 |

* cited by examiner

*Primary Examiner* — Han Yang
(74) *Attorney, Agent, or Firm* — Sterne, Kessler, Goldstein & Fox P.L.L.C.

(57) ABSTRACT

An encoded ROM array structure couples a first one of a first set of bitlines to a second one of a second set of bitlines through a transistor when the wordline connected to the gate terminal of that transistor is asserted. This encoded arrangement can be extended to any number of encoded bitlines, e.g., 2, 4, 8, 16, and so on. Each of the first plurality and second sets of bit lines are coupled to circuits for charging and discharging the bitlines. To read data from the first set of bit lines, the second set of bitlines is discharged, and vice versa.

20 Claims, 8 Drawing Sheets

| Read Cycle | Bit line state | | | | | | | | CPD line state | | Decoded data | | | |
|---|---|---|---|---|---|---|---|---|---|---|---|---|---|---|
| | BL7 | BL6 | BL5 | BL4 | BL3 | BL2 | BL1 | BL0 | CPD0 | CPD1 | D3 | D2 | D1 | D0 |
| Cycle 1 | - | - | - | - | 1 | 1 | 1 | 0 | 0 | - | - | - | 0 | 0 |
| | - | - | - | - | 1 | 1 | 0 | 1 | 0 | - | - | - | 0 | 1 |
| | - | - | - | 0 | 1 | 0 | 1 | 1 | 0 | - | - | - | 1 | 0 |
| | - | - | - | 1 | 0 | 1 | 1 | 1 | 0 | - | - | - | 1 | 1 |
| Cycle 2 | 1 | 1 | 1 | 1 | - | - | - | - | 0 | 1 | 0 | 0 | - | - |
| | 1 | 1 | 1 | 1 | - | - | - | - | 0 | 1 | 0 | 1 | - | - |
| | 1 | 1 | 0 | 1 | - | - | - | - | 0 | 1 | 1 | 0 | - | - |
| | 0 | 1 | 1 | 1 | - | - | - | - | 0 | 1 | 1 | 1 | - | - |

BL*: '0' -> Bitline is programmed to the bitcell transistor
'1' -> Bitline is not programmed to the bitcell transistor CPD*: '0' -> CPD line is driven LO
'1' -> CPD line is drive HI

| Read Cycle | Bit line state | | | | | | | | | | | | Decoded data | | | |
|---|---|---|---|---|---|---|---|---|---|---|---|---|---|---|---|---|
| | BL11 | BL10 | BL9 | BL8 | BL7 | BL6 | BL5 | BL4 | BL3 | BL2 | BL1 | BL0 | D3 | D2 | D1 | D0 |
| Cycle 1 | - | - | - | - | LO | LO | LO | LO | 1 | 1 | 1 | 0 | - | - | 0 | 0 |
| | - | - | - | - | LO | LO | LO | LO | 1 | 1 | 0 | 1 | - | - | 0 | 1 |
| | - | - | - | - | LO | LO | LO | LO | 1 | 0 | 1 | 1 | - | - | 1 | 0 |
| | - | - | - | - | LO | LO | LO | 0 | 0 | 1 | 1 | 1 | - | - | 1 | 1 |
| Cycle 2 | HI | HI | HI | HI | 1 | 1 | 1 | 1 | LO | LO | LO | LO | 0 | 0 | - | - |
| | HI | HI | HI | HI | 1 | 1 | 0 | 1 | LO | LO | LO | LO | 0 | 1 | - | - |
| | HI | HI | HI | HI | 1 | 0 | 1 | 1 | LO | LO | LO | LO | 1 | 0 | - | - |
| | HI | HI | HI | HI | 0 | 1 | 1 | 1 | LO | LO | LO | LO | 1 | 1 | - | - |

BL*:
'0' -> Bitline is programmed to the bitcell transistor
'1' -> Bitline is not programmed to the bitcell transistor
'LO' -> Bitline is driven LO
'HI' -> Bitline is driven HI

READ ONLY MEMORY ARRAY ARCHITECTURE AND METHODS OF OPERATION

FIELD OF THE INVENTION

The present invention relates generally to integrated circuits, and more particularly to read only memory.

BACKGROUND

Advances in semiconductor manufacturing technologies have resulted in dramatically increased circuit packing densities and higher speeds of operation. In order to achieve such increased densities a wide variety of evolutionary changes have taken place with respect to semiconductor processing techniques and semiconductor device structures over the years.

Similarly, advances in digital systems architecture and circuit design have resulted in greater functionality being packed into ever smaller areas of integrated circuits. One consequence of the increased speed and functionality of integrated circuits has been the development of products that require larger amounts data storage. Data storage may be referred to herein as memory.

What is needed are structures and methods for increasing the density of integrated circuit memory.

BRIEF DESCRIPTION OF THE DRAWINGS

Embodiments of the invention are described with reference to the accompanying drawings. In the drawings, like reference numbers indicate identical or functionally similar elements. Additionally, the left most digit(s) of a reference number identifies the drawing in which the reference number first appears.

The figures illustrate various components, their arrangements, and interconnections. Unless expressly stated to the contrary, the figures are not necessarily drawn to scale.

DETAILED DESCRIPTION

The following Detailed Description refers to accompanying drawings to illustrate exemplary embodiments consistent with the invention. References in the Detailed Description to "one exemplary embodiment," "an illustrative embodiment", "an exemplary embodiment," and so on, indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

TERMINOLOGY

The terms, chip, die, integrated circuit, semiconductor device, and microelectronic device, are often used interchangeably in the field of electronics. The present invention is applicable to all the above as these terms are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as aluminum (Al), copper (Cu), an alloy of Al and Cu, an alloy of Al, Cu and silicon (Si), tungsten (W), and nickel (Ni) are examples of conductors that may provide signal paths for coupling or interconnecting, electrical circuitry. Other conductors, both metal and non-metal are available in microelectronic devices. Materials such as gold, cobalt, doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

FET, as used herein, refers to metal-oxide-semiconductor field effect transistors (MOSFETs). An n-channel FET is referred to herein as an NFET. A p-channel FET is referred to herein as a PFET.

As used herein, "gate" refers to the insulated gate terminal of a FET.

Source/drain (S/D) terminals refer to the terminals of a FET, between which conduction occurs under the influence of an electric field, subsequent to the inversion of the semiconductor surface under the influence of an electric field resulting from a voltage applied to the gate terminal of the FET. Generally, the source and drain terminals of a FET are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

The terms contact and via, both refer to structures for electrical connection of conductors from different levels of a chip. By way of example and not limitation, such electrical connections may be made between two metal lines on different interconnect levels of a chip, between a polysilicon line and a metal line, between a S/D junction and a metal line, and so on. These terms are sometimes used in the art to describe both an opening in an insulator in which the structure will be completed, and the completed structure itself. For purposes of this disclosure, contact and via both refer to the completed structure. Further, for purposes of this disclosure, contact refers to the structure used to form a connection between polysilicon or S/D junction and the first layer of metal; and via refers to the structure used to form a connection between metal layers.

ROM is an acronym for Read Only Memory. ROMs are a non-volatile form of memory. Data is typically programmed into a ROM during the manufacturing process. Programming of ROMs during the manufacturing process is commonly referred to as "mask-programming." ROMs are often used within integrated circuits to store information for use by other circuits within the integrated circuit. ROMs have also been manufactured as stand-alone memory devices that are accessed by other integrated circuits external to the stand-alone memory device.

Substrate, as used herein, refers to the physical object that is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials.

The term vertical, as used herein, means substantially perpendicular to the surface of a substrate.

Overview

Various embodiments provide an encoded ROM array structure that couples a first one of a first set of bitlines to a second one of a second set of bitlines through a transistor when the wordline connected to the gate terminal of that transistor is asserted. This encoded arrangement can be extended to any number of encoded bitlines, e.g., 2, 4, 8, 16, and so on. This arrangement is referred to herein as "dual-side" programming. Dual-side programming increases the ratio of data bits stored per transistor used in the ROM array. Dual-side programming also eliminates pathways that are only dedicated to providing a path to ground for bitlines in the ROM array.

The dual-side programming arrangements described herein provide advantages over previous read only memory architectures including, but not limited to, reduced leakage currents, and greater layout density.

Before providing further details of the dual-side programming architecture, conventional read/write and read-only memories are briefly discussed to provide technical background and nomenclature.

There is a well-recognized need for storing data in digital circuits and systems. This data storage function is provided by circuitry referred to generally as "memory." Both read/write and read-only memories have been developed. In some instances the memory is required to provide both read and write access. Providing both read and write access requires providing the capability to change the contents of memory during operation. In other instances, the stored data is fixed, i.e., unchanging during operation. For those applications in which the stored data remains unchanged, there is no need to provide the capability to write new data into the memory circuits during operation. Thus, for applications where stored data remains unchanging, there is no need to include the circuitry for providing write access. These read only memories are a denser, and less costly form of memory to manufacture.

Figure 1:
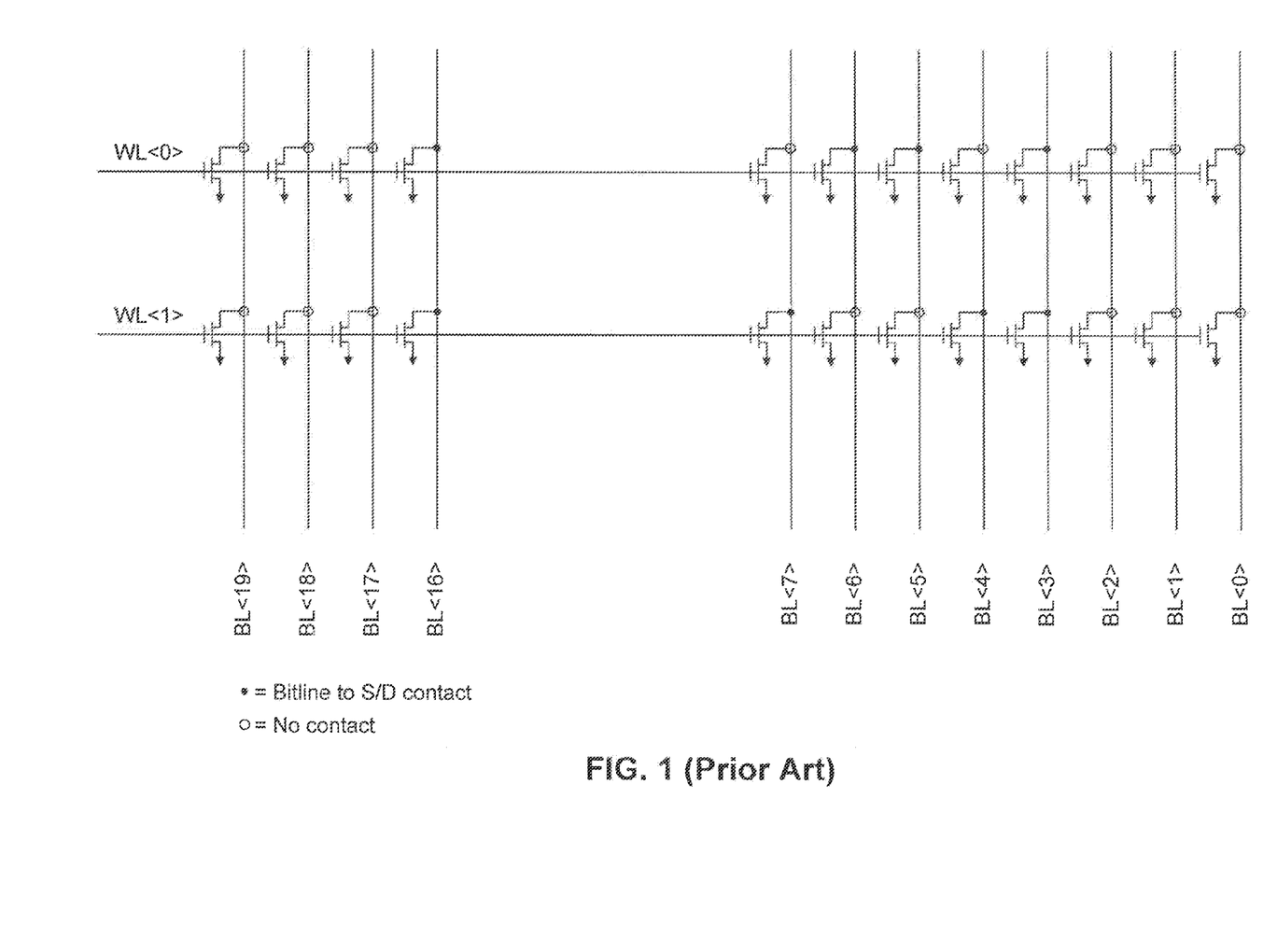
FIG. 1 is a schematic representation of a mask-programmed ROM array having one transistor per bit of storage.

Early ROM designs provided a "matrix" or "array" defined by a plurality of bitlines oriented in a first direction, and a plurality of wordlines oriented in a perpendicular direction. A site at which a wordline and a bitline "intersected" was the site of a "bit cell." In order to store information in such ROM arrays, some wordline/bitline intersection sites included a transistor coupled drain-to-source between the bit line and a ground line, with the gate terminal of that transistor coupled to a wordline, and the other wordline/bitline intersection sites were not provided with these connections. FIG. 1 is a schematic diagram of such a ROM array design. In this circuit configuration, when a wordline was asserted, predetermined ones of the bitlines were pulled to ground through the coupled transistors and the others were not. The two states required to store one bit of data are provided by the presence or absence of the pathway from bitline to ground through the transistor. The presence or absence of a connection from the bitline to the bit cell transistor is shown by a solid dot (mask programmed contact is present thus making connection) or by a circle (mask programmed contact is absent thus no connection is present between the bitline and that bit cell transistor). "Programming" such a ROM was typically accomplished by providing a contact, or via, between the bitline and the drain terminal of the transistor. These designs were much simpler than memory circuits that were required to provide both read and write capabilities. Because these ROM designs were simpler, they also, advantageously, required much less area to implement.

Even though ROM designs such as the one illustrated in FIG. 1 were very dense, i.e., layout efficient, they still required enough chip area to include one transistor per bit of storage.

Figure 2:
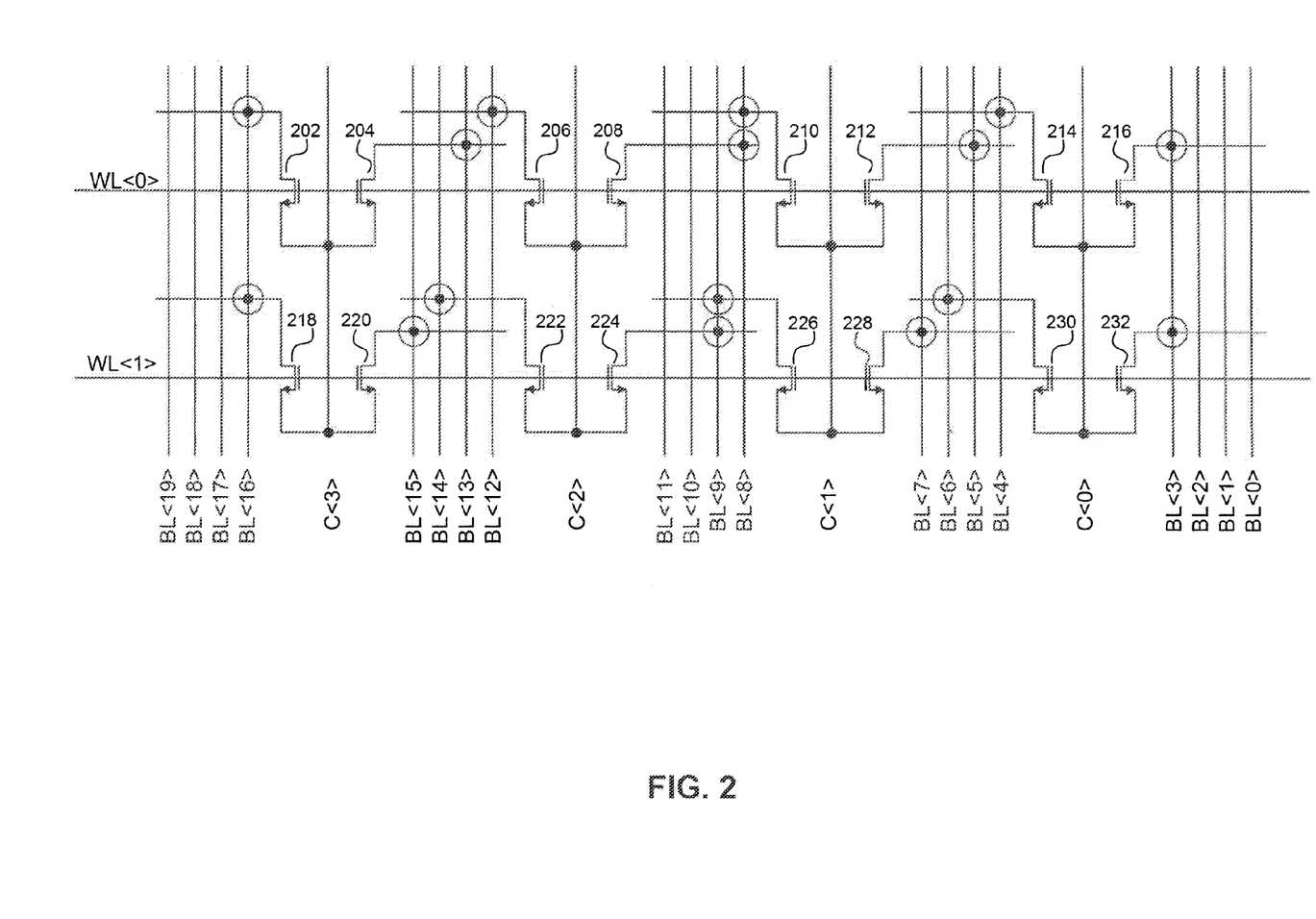
FIG. 2 is a schematic representation of a mask-programmed ROM array having one transistor per two-bits of storage.

To create an even denser layout and to use fewer transistors to store information, the 2-bit encoded data storage scheme for ROMs was developed. FIG. 2 illustrates the 2-bit encoded ROM design. In this exemplary 2-bit encoded ROM array, each transistor has four bitlines to "program onto." That is, in this arrangement, any one of a predetermined group of four bitlines may be coupled to the transistor, typically by mask programming. Because the transistors in these 2-bit encoded ROM arrays are involved in storing more than one bit, the term "bit cell" is not apropos. Therefore these transistors are referred to herein simply as "array transistors". This label is used to distinguish the transistors that are used to specify two or more bits of information from those used to specify a single bit of information. No distinction in electrical characteristics is implied by this terminology. Bit cell transistors and array transistors may be the same or different in terms of their physical structure and/or electrical characteristics.

In FIG. 2 it can be seen that the array transistors are arranged in rows and columns. Every two adjacent columns of array transistors shares the same group of four bitlines. A first S/D terminal of each array transistor in each column is connected to a node that is normally precharged to a positive voltage. The magnitude of the positive voltage is predetermined by the designer. This node is referred to herein as a column pull-down (CPD) line. The CPD is pulled down to a low voltage when the column of array transistors is accessed. Adjacent columns of array transistors share a common CPD line. The CPD line provides a path to ground for the "programmed" bitline.

Still referring to FIG. 2, an NFET 202 has a gate terminal coupled to a wordline WL<0>; a drain terminal is coupleable to any one of bitlines BL<19>, BL<18>, BL<17>, and BL<16>, and coupled to bitline BL<16>; and a source terminal coupled to column pull-down line C<3>. NFET 202 is turned on when WL<0> is asserted, and while NFET 202 is on, BL<16> is electrically coupled to C<3>. In order to sense the states of bitlines BL<19>, BL<8>, BL<17>, and BL<16>, column pull-down line C<3> is pulled to ground. A pathway for current to flow from the bitline to the column pull-down line is provided by NFET 202 when W<0> is asserted.

NFET 204 has a gate terminal coupled to a wordline WL<0>; a drain terminal is coupleable to any one of bitlines BL<15>, BL<14>, BL<13>, and BL<12>, and coupled to bitline BL<13>; and a source terminal coupled to common pull-down line C<3>. NFET 204 is turned on when WL<0> is asserted, and while NFET 204 is on, BL<13> is electrically coupled to C<3>. In order to sense the states of bitlines BL<15>, BL<14>, BL<13>, and BL<12>, common pull-down line C<3> is pulled to ground. A pathway for current to flow from the bitline to the column pull-down line is provided by NFET 204 when W<0> is asserted. Current flows when the voltage between the bitline and the column pull-down line is non-zero. In typical embodiments the bitline is precharged "high" and the common pull-down line is discharged to ground. The same is true for the other transistors in the array.

NFET 206 has a gate terminal coupled to a wordline WL<0>; a drain terminal is coupleable to any one of bitlines BL<15>, BL<14>, BL<13>, and BL<12>, and coupled to bitline BL<12>; and a source terminal coupled to common pull-down line C<2>. NFET 206 is turned on when WL<0> is asserted, and while NFET 206 is on, BL<12> is electrically coupled to C<2>. In order to sense the states of bitlines BL<15>, BL<14>, BL<13>, and BL<12>, common pull-down line C<2> is pulled to ground. A pathway for current to flow between the bitline to the column pull-down line is provided by NFET 204 when W<0> is asserted. Current flows when the voltage between the bitline and the column pull-down line is non-zero. In typical embodiments the bitline is precharged "high" and the common pull-down line is discharged to ground.

NFET 208 has a gate terminal coupled to a wordline WL<0>; a drain terminal that is coupleable to any one of bitlines BL<11>, BL<10>, BL<9>, and BL<8>, and coupled to bitline BL<8>; and a source terminal coupled to common pull-down line C<2>. NFET 208 is turned on when WL<0> is asserted, and while NFET 208 is on, BL<8> is electrically coupled to C<2>. In order to sense the states of bitlines BL<11>, BL<10>, BL<9>, and BL<8>, common pull-down line C<2> is pulled to ground. A pathway for current to flow from the bitline to the common pull-down line is provided by NFET 208 when W<0> is asserted.

NFET 210 has a gate terminal coupled to a wordline WL<0>; a drain terminal that is coupleable to any one of bitlines BL<1>, BL<10>, BL<9>, and BL<8>, and coupled to bitline BL<8>; and a source terminal coupled to common pull-down line C<1>. NFET 210 is turned on when WL<0> is asserted, and while NFET 210 is on, BL<8> is electrically coupled to C<1>. In order to sense the states of bitlines BL<11>, BL<10>, BL<9>, and BL<8>, common pull-down line C<1> is pulled to ground. A pathway for current to flow from the programmed bitline, BL<8>, to the common pull-down line, C<1>, is provided by NFET 210 when W<0> is asserted.

NFET 212 has a gate terminal coupled to a wordline WL<0>; a drain terminal that is coupleable to any one of bitlines BL<7>, BL<6>, BL<5>, and BL<4>, and coupled to bitline BL<5>; and a source terminal coupled to common pull-down line C<1>. NFET 212 is turned on when WL<0> is asserted, and while NFET 212 is on, BL<5> is electrically coupled to C<1>. In order to sense the states of bitlines BL<7>, BL<6>, BL<5>, and BL<4>, common pull-down line C<1> is pulled to ground. A pathway for current to flow from the programmed bitline, BL<5>, to the common pull-down line, C<1>, is provided by NFET 212 when W<0> is asserted.

NFET 214 has a gate terminal coupled to a wordline WL<0>; a drain terminal that is coupleable to any one of bitlines BL<7>, BL<6>, BL<5>, and BL<4>, and coupled to bitline BL<4>; and a source terminal coupled to common pull-down line C<0>. NFET 214 is turned on when WL<0> is asserted, and while NFET 214 is on, BL<4> is electrically coupled to C<0>. In order to sense the states of bitlines BL<7>, BL<6>, BL<5>, and BL<4>, common pull-down line C<0> is pulled to ground. A pathway for current to flow from the programmed bitline, BL<4>, to the common pull-down line, C<0>, is provided by NFET 214 when W<0> is asserted.

NFET 216 has a gate terminal coupled to a wordline WL<0>; a drain terminal that is coupleable to any one of bitlines BL<3>, BL<2>, BL<1>, and BL<0>, and coupled to bitline BL<3>; and a source terminal coupled to common pull-down line C<0>. NFET 216 is turned on when WL<0> is asserted, and while NFET 216 is on, BL<3> is electrically coupled to C<0>. In order to sense the states of bitlines BL<3>, BL<2>, BL<1>, and BL<0>, common pull-down line C<0> is pulled to ground. A pathway for current to flow from the programmed bitline, BL<3>, to the common pull-down line, C<0>, is provided by NFET 216 when W<0> is asserted.

Likewise NFETs 218, 220, 222, 224, 226, 228, 230 and 232 are similarly disposed, each have a gate terminal coupled to a wordline WL<1>. These NFETs are disposed between the bitlines and common pull-down lines as shown in the schematic representation of FIG. 2.

Figure 3:
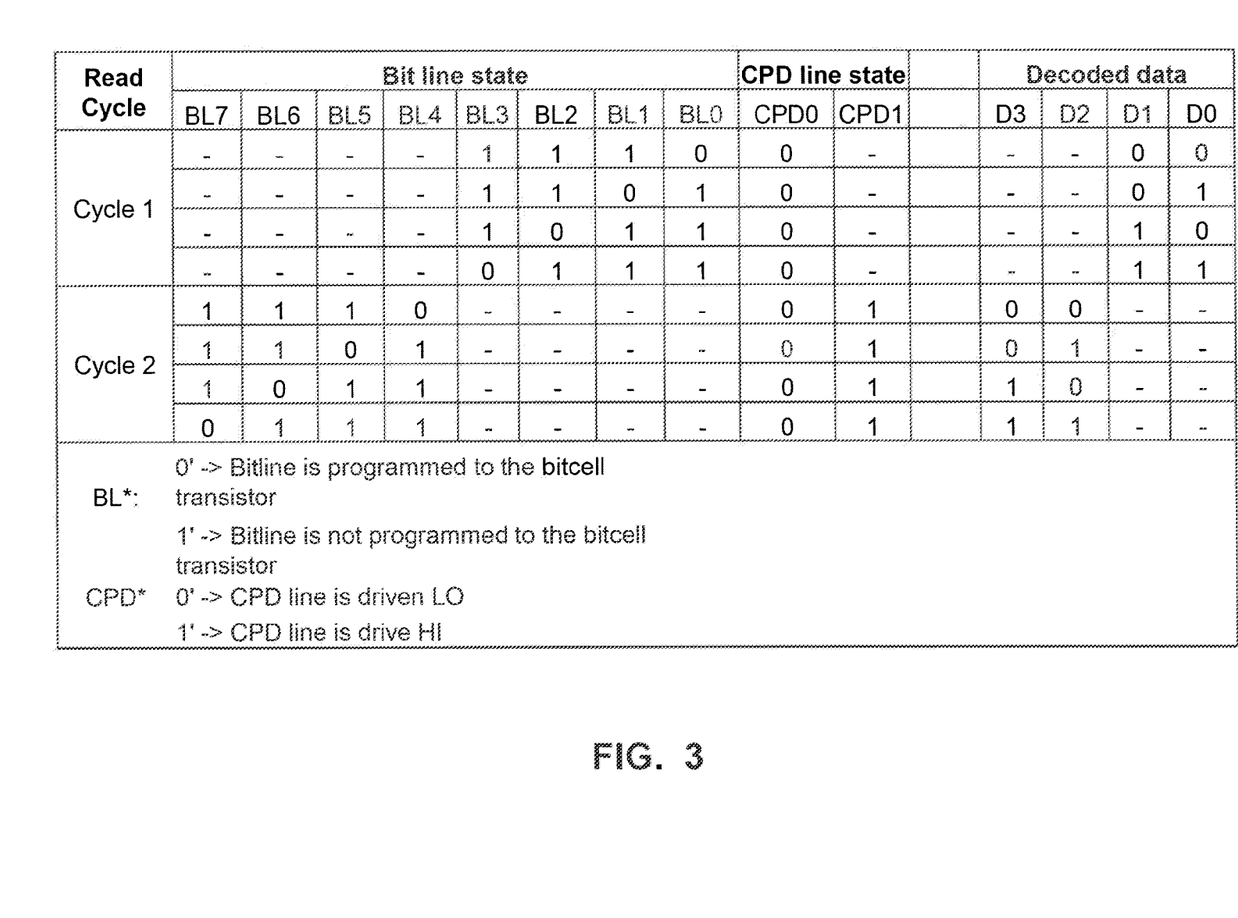
FIG. 3 is a truth table illustrating the functionality of the 2-bit encoded ROM array of FIG. 2.

FIG. 3 is a truth table that documents the functionality of the 2-bit encoded ROM array. More particularly, it can be seen from FIG. 3 that two cycles are needed to complete a read operation and that common pull-down lines must be used in addition to bitlines and wordlines.

However, as semiconductor manufacturing processes continue to advance deep into the nanometer technology nodes, new trade-offs are being faced by integrated circuit designers.

Circuit Arrangement for 4-Bit Encoded ROM

Figure 4:
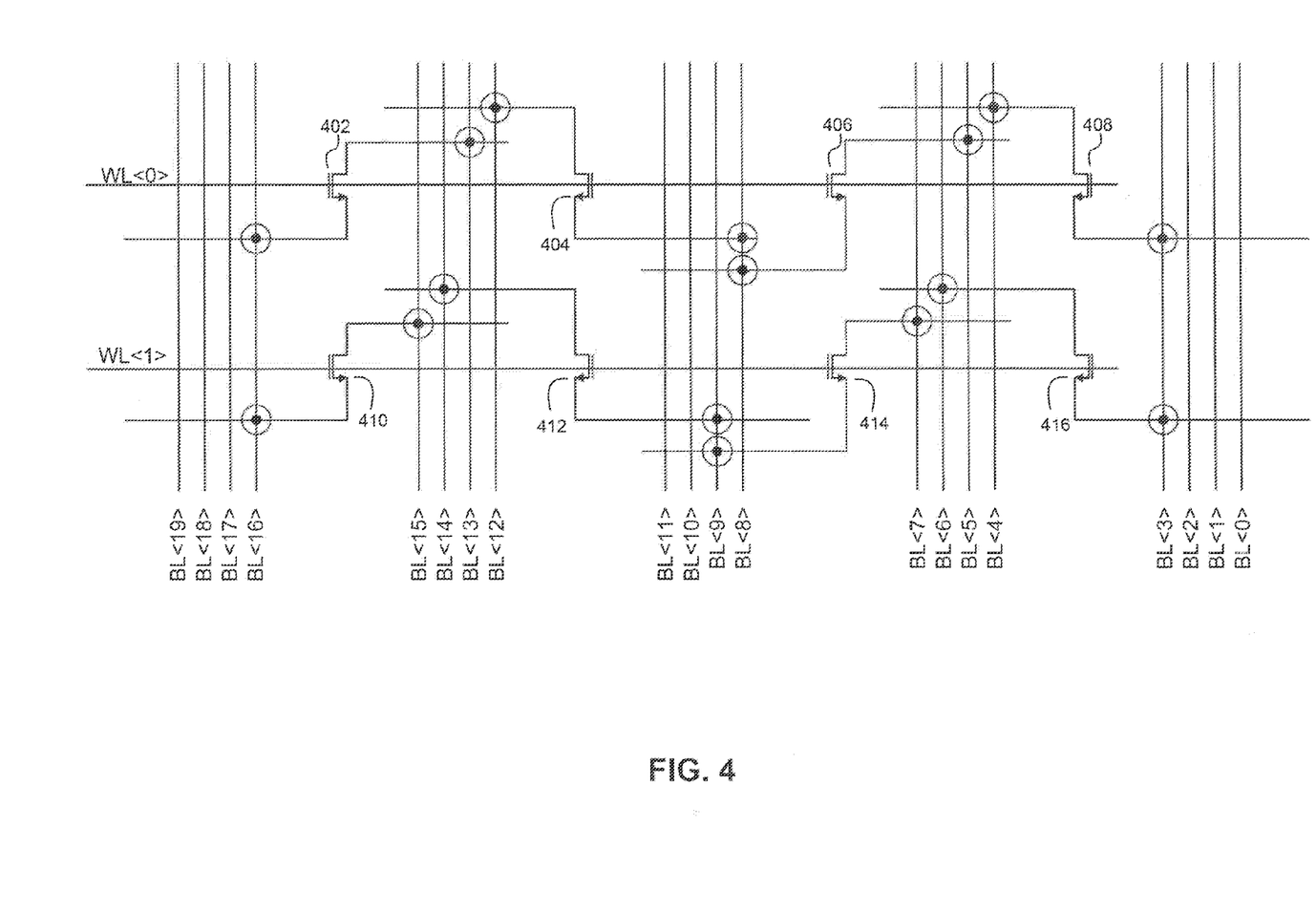
FIG. 4 is a schematic representation of a mask-programmed ROM array having one transistor per four-bits of storage.

The conventional ROM array of FIG. 1 uses the presence or absence of a connection between a bitline and a ground line through one transistor to specify each bit (i.e., two states) of information stored in the array. By contrast, the 4-bit encoded ROM array, as illustrated in FIG. 4, uses one transistor to specify four bits of information stored in the array, and each such transistor is coupled to two bitlines out of a set of eight bit lines. Put differently, in the conventional arrangement each array transistor can specify one of two states (one bit), whereas in the 4-bit encoded arrangement each array transistor can specify one of sixteen states (four bits).

In the exemplary 4-bit encoded ROM array illustrated in FIG. 4, each array transistor has a first S/D terminal coupleable to any one of a first set of bit lines, and a second S/D terminal coupleable to any one of a second set of bit lines. As noted above, the designation of any particular S/D terminal as a "source" or a "drain" is typically done on the basis of the voltages to be applied to those terminals during operation. In the exemplary ROM array of FIG. 4, the first S/D terminal and the second S/D terminal, along with their respective bit line connection options are symmetrical. Thus labelling either the first or second S/D terminal as exclusively a "source" or a "drain" is not necessary to describe this ROM array.

FIG. 4 is a schematic representation of a 4-bit encoded of a ROM array. This exemplary ROM array has eight NFETs, twenty bitlines, and two wordlines. A description of the interconnection and operation of the NFETs, bitlines and wordlines is provided below.

Still referring to FIG. 4, an NFET 402 has a gate terminal coupled to a wordline WL<0>; a first S/D terminal coupleable to any one of bitlines BL<19>, BL<18>, BL<17>, and BL<16>, and coupled to bitline BL<16>; a second S/D terminal coupleable to any one of bitlines BL<15>, BL<14>, BL<13>, and BL<12>, and coupled to bitline BL<13>. NFET 402 is turned on when WL<0> is asserted, and while NFET 402 is on, BL<16> is electrically coupled to BL<13>.

An NFET 404 has a gate terminal coupled to wordline WL<0>; a first S/D terminal coupleable to any one of bitlines BL<15>, BL<14>, BL<13>, and BL<12>, and coupled to bitline BL<12>; a second S/D terminal coupleable to any one of bitlines BL<11>, BL<10>, BL<9>, and BL<8>, and coupled to bitline BL<8>. NFET 404 is turned on when WL<0> is asserted, and while NFET 404 is on, BL<12> is electrically coupled to BL<8>.

An NFET 406 has a gate terminal coupled to wordline WL<0>; a first S/D terminal coupleable to any one of bitlines BL<1>, BL<10>, BL<9>, and BL<8>, and coupled to bitline BL<8>; a second S/D terminal coupleable to any one of bitlines BL<7>, BL<6>, BL<5>, and BL<4>, and coupled to bitline BL<5>. NFET 406 is turned on when WL<0> is asserted, and while NFET 406 is on, BL<8> is electrically coupled to BL<5>.

An NFET 408 has a gate terminal coupled to wordline WL<0>; a first S/D terminal coupleable to any one of bitlines BL<7>, BL<6>, BL<5>, and BL<4>, and coupled to bitline BL<4>; a second S/D terminal coupleable to any one of bitlines BL<3>, BL<2>, BL<1>, and BL<0>, and coupled to bitline BL<3>. NFET 408 is turned on when WL<0> is asserted, and while NFET 408 is on, BL<4> is electrically coupled to BL<3>.

An NFET 410 has a gate terminal coupled to a wordline WL<1>; a first S/D terminal coupleable to any one of bitlines BL<19>, BL<18>, BL<17>, and BL<16>, and coupled to bitline BL<16>; a second S/D terminal coupleable to any one of bitlines BL<15>, BL<14>, BL<13>, and BL<12>, and coupled to bitline BL<15>. NFET 410 is turned on when WL<1> is asserted, and while NFET 410 is on, BL<16> is electrically coupled to BL<15>.

An NFET 412 has a gate terminal coupled to wordline WL<1>; a first S/D terminal coupleable to any one of bitlines BL<15>, BL<14>, BL<13>, and BL<12>, and coupled to bitline BL<14>; a second S/D terminal coupleable to any one of bitlines BL<11>, BL<10>, BL<9>, and BL<8>, and coupled to bitline BL<9>. NFET 412 is turned on when WL<1> is asserted, and while NFET 412 is on, BL<14> is electrically coupled to BL<9>.

An NFET 414 has a gate terminal coupled to wordline WL<1>; a first S/D terminal coupleable to any one of bitlines BL<11>, BL<10>, BL<9>, and BL<8>, and coupled to bitline BL<9>; a second S/D terminal coupleable to any one of bitlines BL<7>, BL<6>, BL<5>, and BL<4>, and coupled to bitline BL<7>. NFET 414 is turned on when WL<1> is asserted, and while NFET 414 is on, BL<9> is electrically coupled to BL<7>.

An NFET 416 has a gate terminal coupled to wordline WL<1>; a first S/D terminal coupleable to any one of bitlines BL<7>, BL<6>, BL<5>, and BL<4>, and coupled to bitline BL<6>; a second S/D terminal coupleable to any one of bitlines BL<3>, BL<2>, BL<1>, and BL<0>, and coupled to bitline BL<3>. NFET 416 is turned on when WL<1> is asserted, and while NFET 416 is on, BL<6> is electrically coupled to BL<3>.

Still referring to FIG. 4, it can be seen that each of the array transistors is coupleable to any one of four bit lines at its first S/D terminal and coupleable to any one of four bit lines at its second S/D terminal. In this illustrative embodiment, storing information in the ROM array is accomplished by "mask programming." Mask programming in the illustrative 4-bit encoded ROM array involves forming an electrical connection between one of a first set of four bitlines with a first S/D terminal of an array transistor, and forming an electrical connection between one of a second set of four bitlines with a second S/D terminal of the array transistor.

In the illustrative example of FIG. 4, it can also be seen that sets of bitlines are shared by adjacent array transistors in the same row.

Figure 5:
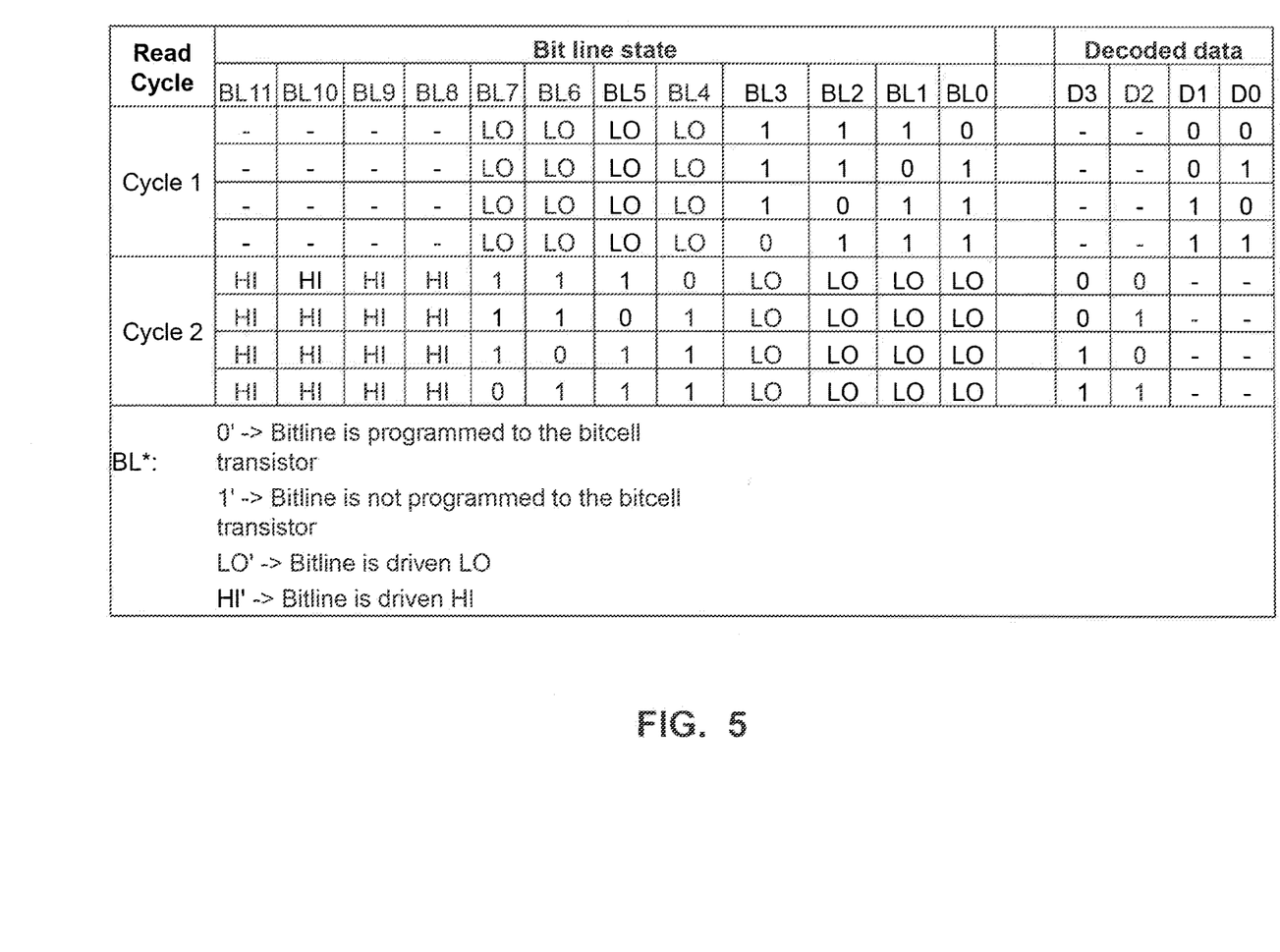
FIG. 5 is a truth table illustrating the functionality of the 4-bit encoded ROM array of FIG. 4.

FIG. 5 is a truth table illustrating the functionality of the four-bit encoded ROM array shown in schematic form in FIG. 4. It can be seen that the four-bit encoded ROM array uses a two-cycle read operation but does not require common pull-down lines.

Circuit Operation for 4-Bit Encoded ROM

Figure 6A:
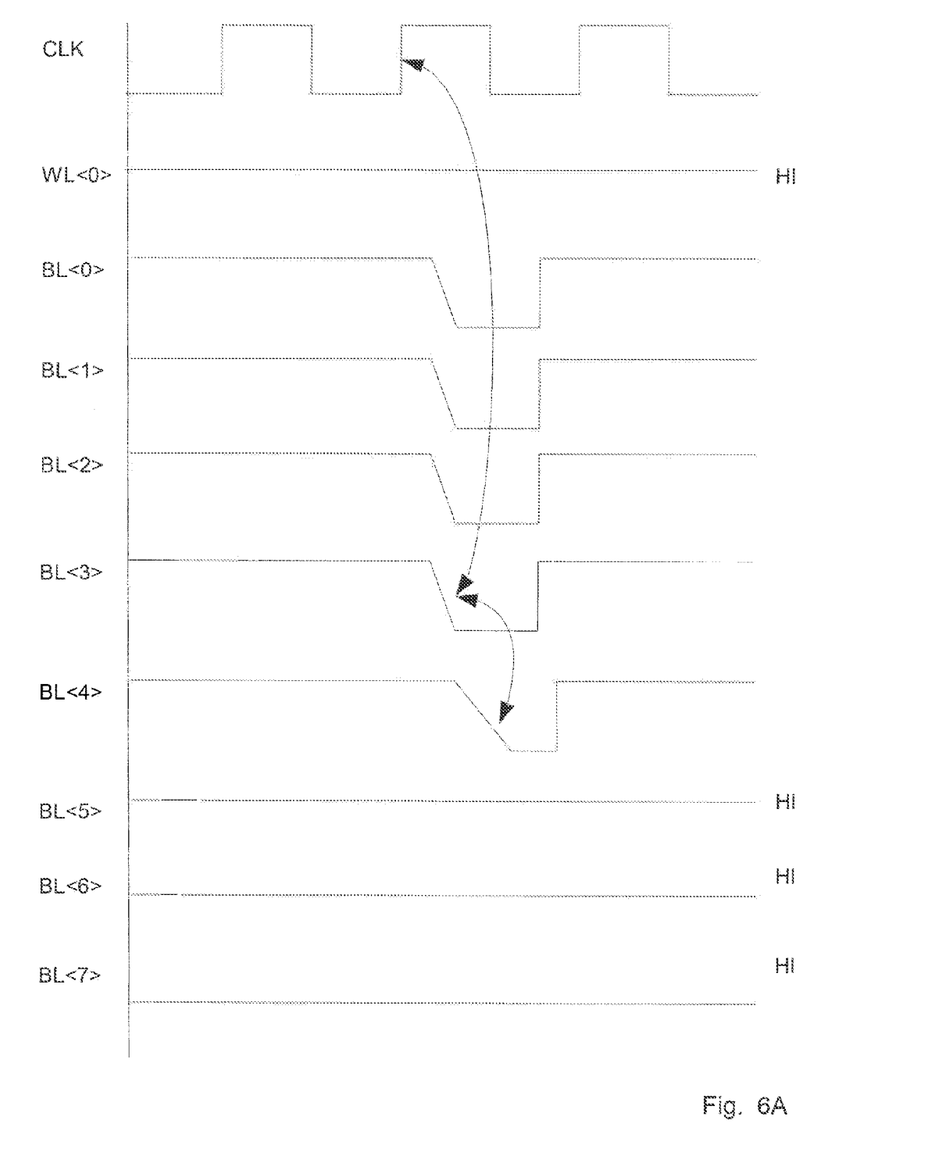
FIG. 6A is a timing diagram illustrating one half of an exemplary two-cycle read operation in a 4-bit encoded ROM array, in which bitlines 0-3 are driven low and bitlines 4-7 are evaluated.
Figure 6B:
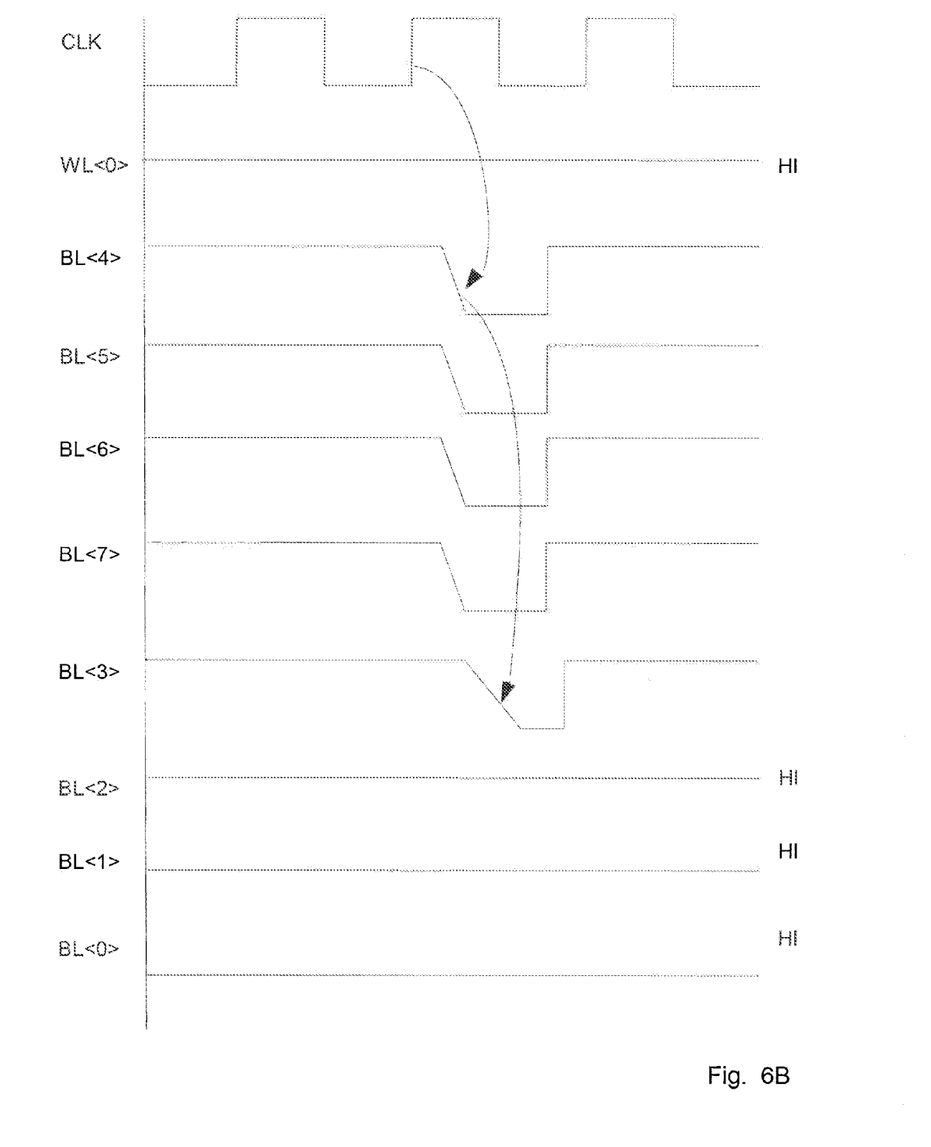
FIG. 6B is a timing diagram illustrating a one half of an exemplary two-cycle read operation in a 4-bit encoded ROM array, in which bitlines 4-7 are driven low and bitlines 0-3 are evaluated.

The operation of an illustrative 4-bit encoded ROM is described in connection with FIGS. 5-6.

An illustrative method of reading data from the 4-bit encoded ROM array involves precharging a first set of bitlines associated with a first S/D terminal of an array transistor, discharging a second set of bitlines associated with a second S/D terminal of the array transistor, and asserting a wordline. FIG. 5 provides an example of a two-cycle read operation where in a one cycle bitlines 4 through 7 are driven low while bitlines 0 through 3 are evaluated; and where in another cycle bitlines 0 through 3 are driven low while bitlines 4 through 7 are evaluated. Embodiments are not restricted to which set of bitlines is driven low or which set of bitlines is evaluated before the other set of bitlines. Once the eight bitlines have been evaluated, four bits of data are available. In this context, the term "cycle" refers to the stage or phase of the read operation and is not necessarily the same as a "clock cycle."

It is noted that each cycle of the memory read operation shown in FIG. 5, may also be referred to as a stage or phase of the memory read operation. In some embodiments, each cycle (stage or phase) of the memory read operation may be associated with one or more clock cycles. FIGS. 6A and 6B illustrate the timing of an exemplary embodiment of a memory read operation and show that multiple clock cycles are used in each memory read operational cycle (stage or phase). In this way, implementations a 4-bit encoded ROM are not limited to any particular clocking scheme.

To sense the data from the first set of bitlines, the second set of bitlines are driven low and the first set of bitlines is precharged high. The first set of bitlines are coupled to a sense amplifier. In this illustrative embodiment, the sense amplifier only needs a partial bitline swing to correctly sense the data. Likewise, to sense the data from the second set of bitlines, the first set of bitlines are driven low. The second set of bitlines are coupled to a sense amplifier. It is noted that use of a sense amplifier is not required to use a 4-bit encoded ROM array configuration, although reading data would take a longer amount of time without the use of a sense amplifier because a larger voltage swing on the bitlines, which takes more time, would be needed to determine the state thereof.

It is noted that an encoded ROM array structure that couples a first one of a first set of bitlines to a second one of a second set of bitlines through a transistor when the wordline connected to the gate terminal of that transistor is asserted can be extended to any number of encoded bitlines, e.g., 2, 4, 8, 16, and so on.

Alternative 4-Bit Encoded ROM Array Structures

It is noted that the bit-bit encoding scheme disclosed herein can be used with memory structures other than the exemplary embodiments described above. For example, it is known that in addition to mask-based contact programming, alternatively designed ROM arrays can be programmed by laser programming operations, or by electrical programming operations. An anti-fuse based laser programmed ROM design that incorporates the 4-bit encoded structure of the invention is described below.

The term, anti-fuse, refers to a passive electrical component that is normally in a non-conductive, or high resistance, state, and which can be changed to a conducting, or low resistance state. Programming an anti-fuse, i.e., changing the state of the anti-fuse from electrically non-conducting to electrically conducting, can be achieved by among other things, laser heating of the anti-fuse. This is referred to as laser programming. A variety of anti-fuse materials, structures, manufacturing methods, and programming techniques are known, and the alternative embodiments described in this section are not limited to any particular anti-fuse technology.

The 4-bit encoding scheme used in various embodiments can be used in configurations where the connections between the bitlines and the S/D terminals is made without the use of mask programming. For example, rather than programming the 4-bit encoded ROM array by forming contacts or vias between a bitline and a S/D terminal, a 4-bit encoded ROM array can be provided with an anti-fuse at each location where a bitline and a S/D terminal of an array transistor may intersect. In such an alternative embodiment, one anti-fuse is disposed between each one of a first set of four bitlines and a first S/D terminal of an array transistor, and one anti-fuse is disposed between each one of a second set of four bitlines and a second S/D terminal of the array transistor. Storing information in the anti-fuse-equipped 4-bit encoded ROM array can be achieved by programming the anti-fuses such that there is an electrically conductive pathway between a first single bitline of the first set of bitlines and the first S/D terminal of the array transistor, and a second single bitline of the second set of bitlines and the second S/D terminal of the array transistor. In this way, when the wordline coupled to the gate terminal of the array transistor is asserted, an electrically conductive pathway is established between the first single bitline of the first set of bitlines and the second single bitline of the second set of bitlines.

One illustrative four-bit encoded ROM array includes a plurality of field effect transistors (FETs), each FET having a first source/drain (S/D) terminal and a second S/D terminal; a plurality of bitlines arranged in groups of four; and a plurality of wordlines. The plurality of FETs is disposed in an array to form rows and columns. One wordline is disposed for each row of FETs and is coupled to the gate terminal of each FET in that row. Each one of a first group of four bitlines is coupleable by mask programming to the first S/D terminal of each of the FETs in a first column of FETs, and each one of a second plurality of bit lines is coupleable, by mask programming, to the second S/D terminal of each of FETs in the first column. In the illustrative embodiments, for each row, a predetermined one of the first plurality of bitlines is coupled by mask programming to the first S/D terminals. Likewise, a predetermined one of the second plurality of bitlines is coupled by mask programming to the second S/D terminals. In typical embodiments, ground path circuitry, precharge circuitry and voltage sensing circuitry is coupled to all the bitlines. During a first clock cycle of a read operation, the first set of bitlines is coupled to ground; the second set of bitlines is precharged, a wordline is asserted, and the voltage sense circuitry determines which one of the second set of bitlines is coupled to ground. During a second clock cycle of the read operation, the second set of bitlines is coupled to ground; the first set of bitlines is precharged, a wordline remains asserted, and the voltage sense circuitry determines which one of the first set of bitlines is coupled to ground.

An illustrative ROM encoded with a dual-side programming arrangement, includes a plurality of transistors disposed in an array of rows and columns, each transistor having a gate terminal, a first S/D terminal and a second S/D terminal; a first set of bitlines disposed adjacent a first side of a first column of transistors; a second set of bitlines disposed adjacent a second side of a second column of transistors; a first wordline coupled to the gate terminal of each transistor in a first row of transistors; first circuitry coupled to the first set of bitlines and configured to discharge the first set of bitlines when the second set of bitlines are to be read; and second circuitry coupled the second set of bitlines and configured to discharge the second set of bitlines when the first set of bitlines are to be read; wherein each one of the first set of bitlines is coupleable to the first S/D terminal of a first transistor disposed in the first row and in the first column, each one of the second set of bitlines is coupleable to the second S/D terminal of the first transistor; a first one of the first set of bitlines is coupled to the first S/D terminal of the first transistor and a first one of the second set of bitlines is coupled to the second S/D terminal of the first transistor.

An illustrative ROM encoded with a dual-side programming arrangement, includes a plurality of switchable conductive pathways disposed in an array of rows and columns, each switchable conductive pathway having a control terminal, a first terminal and a second terminal; a first set of bitlines disposed adjacent a first side of a first column of switchable conductive pathways; a second set of bitlines disposed adjacent a second side of a second column of switchable conductive pathways; a first wordline coupled to the control terminal of each switchable conductive pathway in a first row of switchable conductive pathways; first circuitry coupled to the first set of bitlines and configured to discharge the first set of bitlines when the second set of bitlines are to be read; and second circuitry coupled the second set of bitlines and configured to discharge the second set of bitlines when the first set of bitlines are to be read; wherein each one of the first set of bitlines is coupleable to the first terminal of a first switchable conductive pathway disposed in the first row and in the first column, each one of the second set of bitlines is coupleable to the second terminal of the first switchable conductive pathway; a first one of the first set of bitlines is coupled to the first terminal of the first switchable conductive pathway and a first one of the second set of bitlines is coupled to the second terminal of the first switchable conductive pathway. A switchable conductive pathway is typically implemented as a transistor. Any suitable switchably conductive circuit element may be used to implement the function of the switchable conductive pathway. FETs are commonly used in integrated circuits to fulfill this role. In this illustrative embodiment an NFET is used as a switchable conductive pathway where conduction takes place between the S/D terminals of the NFET and switching between the "on" and the "off" states is controlled by a voltage applied to the gate terminal of the NFET. Various embodiments may use switchably conductive circuit elements other than transistors. For example, microelectromechanical systems (MEMS) may provide physical switches that are controlled by an applied electrical field. The invention is not limited to any particular circuit elements for implementation as long as the function of a switchable conductive pathway is obtained.

Figure 7:
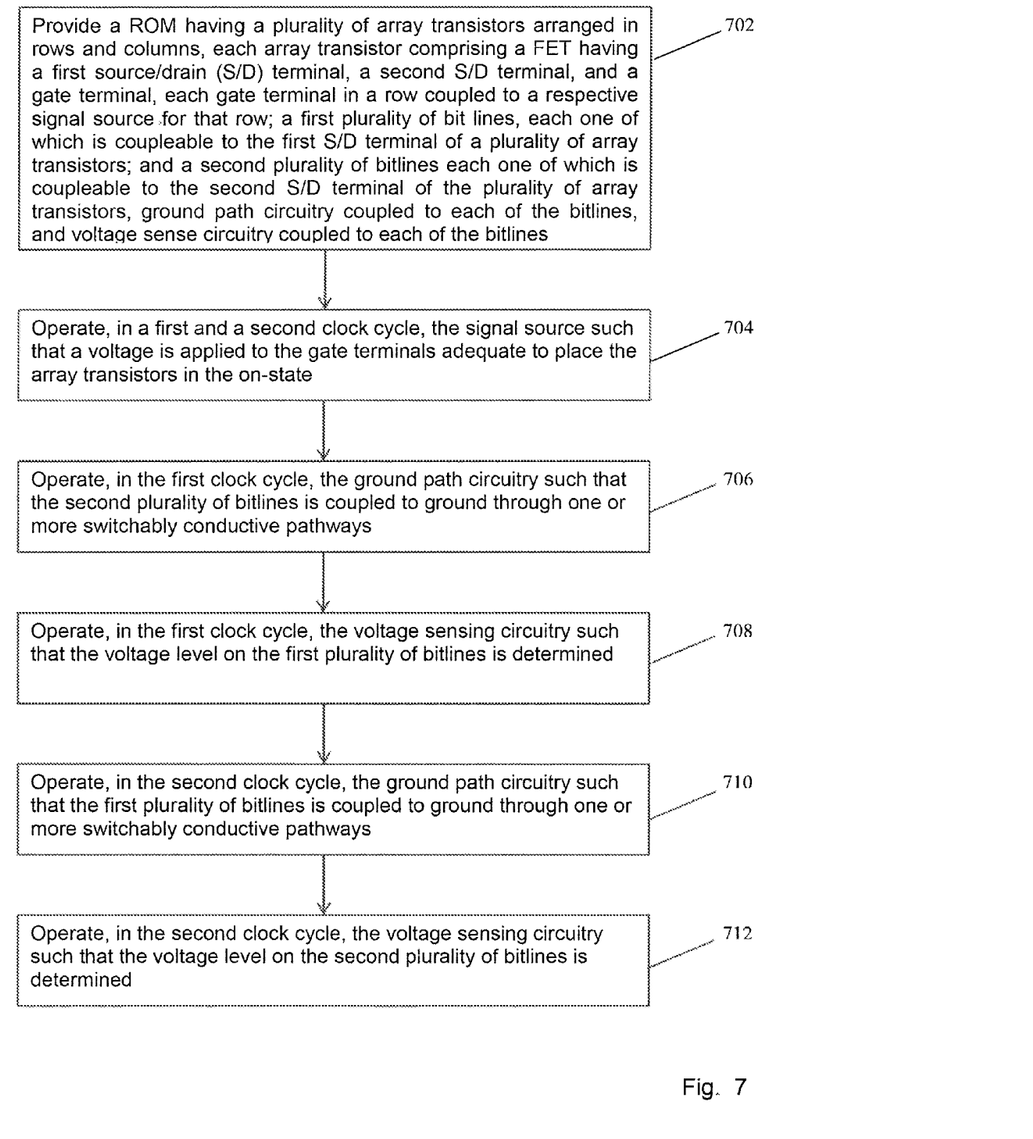
FIG. 7 is a flow diagram illustrating the operation of an exemplary 4-bit encoded ROM array.

With reference to FIG. 7, an illustrative method of reading data from a four-bit encoded ROM, includes providing 702 a ROM having a plurality of array transistors arranged in rows and columns, each array transistor comprising a FET having a first source/drain (S/D) terminal, a second S/D terminal, and a gate terminal, each gate terminal in a row coupled to a respective signal source for that row; a first plurality of bit lines, each one of which is coupleable to the first S/D terminal of a plurality of array transistors; and a second plurality of bitlines each one of which is coupleable to the second S/D terminal of the plurality of array transistors, ground path circuitry coupled to each of the bitlines, and voltage sense circuitry coupled to each of the bitlines; operating 704, in a first and a second clock cycle, the signal source such that a voltage is applied to the gate terminals adequate to place the array transistors in the on-state; operating 706, in the first clock cycle, the ground path circuitry such that the second plurality of bitlines is coupled to ground through one or more switchably conductive pathways; operating 708, in the first clock cycle, the voltage sensing circuitry such that the voltage level on the first plurality of bitlines is determined; operating 710, in the second clock cycle, the ground path circuitry such that the first plurality of bitlines is coupled to ground through one or more switchably conductive pathways; and operating 712, in the second clock cycle, the voltage sensing circuitry such that the voltage level on the second plurality of bitlines is determined.

Those skilled in the art of integrated circuit design will appreciate that the layout coordinates needed for mask programming depend on the specific feature sizes and design rules used for the ROM array layout. It will further be appreciated that the ROM array layout can be designed to accommodate mask programming at the contact level, or at one or more via levels, or by a combination of contact and one or more vias. The encoded ROM array architecture described herein is not dependent on any specific layout coordinates or feature sizes of the contacts and/or vias, as long as the desired electrical connections between bitlines and array transistors can be fabricated.

CONCLUSION

It is to be appreciated that the Detailed Description section, and not the Abstract of the Disclosure, is intended to be used to interpret the claims. The Abstract of the Disclosure may set forth one or more, but not all, exemplary embodiments of the invention, and thus, is not intended to limit the invention and the subjoined Claims in any way.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the subjoined Claims and their equivalents.

What is claimed is:

1. A read only memory (ROM) array, comprising:
   a first field effect transistor (FET) in a first column of FETs, the first FET having a first source/drain (S/D) terminal coupled to a first S/D node, a second S/D terminal coupled to a second S/D node, and a gate terminal coupled to a signal source;
   a second FET in a second column of FETs, the second FET having a third S/D terminal coupled to a third S/D node and a fourth S/D terminal coupled to a fourth S/D node;
   a first plurality of bit lines, each one of which is coupleable to the first S/D node;
   a second plurality of bit lines, each one of which is coupleable to the second S/D node or the third S/D node; and
   a third plurality of bit lines, each one of which is coupleable to the fourth S/D node.

2. The ROM array of claim 1, wherein the first FET is an NFET and the signal source is a word line signal source.

3. The ROM array of claim 1, wherein each of the first plurality of bit lines is coupleable to the first S/D node by mask programming, and each of the second plurality of bit lines is coupleable to the second S/D node by mask programming.

4. The ROM array of claim 1, wherein each of the first plurality of bit lines is coupleable to the first S/D node by laser programming, and each of the second plurality of bit lines is coupleable to the second S/D node by laser programming.

5. The ROM array of claim 3, wherein the first plurality of bit lines comprises four bit lines and the second plurality of bit lines comprises four bit lines.

6. A read only memory (ROM) encoded with a dual-side programming arrangement, comprising:
   a plurality of switchable conductive pathways disposed in an array of rows and columns, each switchable conductive pathway having a control terminal, a first terminal and a second terminal;
   a first set of bit lines disposed adjacent a first side of a first column of switchable conductive pathways;
   a second set of bit lines disposed adjacent a second side of the first column of switchable conductive pathways, and adjacent a first side of a second column of switchable conductive pathways;
   a third set of bit lines disposed adjacent a second side of the second column of switchable conductive pathways;
   a first word line coupled to the control terminal of each switchable conductive pathway in a first row of switchable conductive pathways;
   first circuitry coupled to the first set of bit lines and configured to discharge the first set of bit lines when the second set of bit lines are to be read; and
   second circuitry coupled the second set of bit lines and configured to discharge the second set of bit lines when the first set of bit lines are to be read;
   wherein each one of the first set of bit lines is coupleable to a first terminal of a first switchable conductive pathway disposed in the first row and in the first column, each one of the second set of bit lines is coupleable to the second terminal of the first switchable conductive pathway or is coupled to a first terminal of a second switchable conductive pathway disposed in the first row and in the second column; a first one of the first set of bit lines is coupled to the first terminal of the first switchable conductive pathway, a first one of the second set of bit lines is coupled to the second terminal of the first switchable conductive pathway, and a second one of the second set of bit lines is coupled to the first terminal of the second switchable conductive pathway.

7. The ROM of claim 6, wherein the switchable conductive pathway is a transistor.

8. The ROM of claim 7, wherein the transistor is a field effect transistor (FET), the control terminal is a FET gate terminal, the first terminal is a first source/drain (S/D) terminal and the second terminal is a second S/D terminal.

9. The ROM of claim 6, wherein the first one of the first set of bitlines is coupled to the first terminal of the first switchable conductive pathway by mask programming, and a first one of the second set of bitlines is coupled to the second terminal of the first switchable conductive pathway by mask programming.

10. The ROM of claim 9, wherein mask programming comprises one or more contact structures disposed to provide an electrical path between a bitline and a terminal of a switchable conductive pathway.

11. The ROM array of claim 1, wherein the third plurality of bit lines comprises four bit lines.

12. The ROM array of claim 1, wherein the first FET is disposed in a row, and the second FET is disposed in the same row.

13. The ROM array of claim 1, wherein the second S/D node is coupled to a first one of the plurality of second bit lines and the third S/D node is coupled to a second one of the plurality of second bit lines.

14. A read only memory (ROM) array, comprising:
a first field effect transistor (FET) in a first column of FETs, the first FET having a first source/drain (S/D) terminal coupled to a first S/D node, a second S/D terminal coupled to a second S/D node, and a gate terminal coupled to a signal source;
a second FET in a second column of FETs, the second FET having a third S/D terminal coupled to a third S/D node and a fourth S/D terminal coupled to a fourth S/D node;
a first plurality of bit lines, each one of which is coupleable to the first S/D node;
a second plurality of bit lines, each one of which is coupleable to the second S/D node and the third S/D node; and
a third plurality of bit lines, each one of which is coupleable to the fourth S/D node.

15. The ROM array of claim 14, wherein the first FET is an NFET and the signal source is a word line signal source.

16. The ROM array of claim 14, wherein each of the first plurality of bit lines is coupleable to the first S/D node by mask programming, and each of the second plurality of bit lines is coupleable to the second S/D node by mask programming.

17. The ROM array of claim 14, wherein each of the first plurality of bit lines is coupleable to the first S/D node by laser programming, and each of the second plurality of bit lines is coupleable to the second S/D node by laser programming.

18. The ROM array of claim 16, wherein the first plurality of bit lines comprises four bit lines and the second plurality of bit lines comprises four bit lines.

19. The ROM array of claim 16, wherein the third plurality of bit lines comprises four bit lines, and each of the third plurality of bit lines is coupleable to the fourth S/D node by mask programming.

20. The ROM array of claim 14, wherein the second S/D node is coupled to a first one of the plurality of second bit lines and the third S/D node is coupled to a second one of the plurality of second bit lines.

* * * * *